United States Patent
Woodard et al.

[11] Patent Number: 6,117,559
[45] Date of Patent: Sep. 12, 2000

[54] DOUBLE-SIDED REFLECTOR FILMS

[75] Inventors: F. Eugene Woodard, Los Altos; Thomas Pass, Sunnyvale; Ted L. Larsen, Palo Alto, all of Calif.

[73] Assignee: Southwall Technologies, Inc., Palo Alto, Calif.

[21] Appl. No.: 09/050,745

[22] Filed: Mar. 30, 1998

Related U.S. Application Data

[63] Continuation of application No. 08/743,418, Nov. 1, 1996, Pat. No. 5,840,161, which is a continuation of application No. 08/303,342, Sep. 9, 1994, abandoned.

[51] Int. Cl.$^7$ .......................... B32B 15/04; B32B 27/06; B32B 27/16; B32B 27/36
[52] U.S. Cl. .......................... 428/458; 428/34; 428/457; 428/480; 428/622; 428/626; 428/673; 427/533; 427/535; 427/536; 204/192.1; 204/192.12; 204/192.26; 204/192.27; 204/192.22
[58] Field of Search .......................... 428/34, 457, 458, 428/480, 622, 626, 620, 331, 632, 673; 427/533, 535, 536; 204/192.1, 192.12, 192.22, 192.26, 192.27

[56] References Cited

U.S. PATENT DOCUMENTS

| | | |
|---|---|---|
| 4,322,276 | 3/1982 | Meckel et al. ................. 204/192 P |
| 4,337,990 | 7/1982 | Fan et al. ................. 350/1.7 |
| 4,354,911 | 10/1982 | Dodd et al. . |
| 4,428,346 | 1/1984 | Jacobson et al. ................. 204/192.14 |
| 4,455,207 | 6/1984 | Sartor et al. . |
| 4,875,963 | 10/1989 | Paschke et al. ................. 156/249 |
| 4,886,681 | 12/1989 | Clabes et al. ................. 427/38 |
| 5,009,761 | 4/1991 | Robinson ................. 204/192.14 |
| 5,071,206 | 12/1991 | Hood et al. ................. 359/360 |

FOREIGN PATENT DOCUMENTS

| | | |
|---|---|---|
| 2685350 | 6/1993 | France . |
| 766459 | 1/1957 | United Kingdom . |

OTHER PUBLICATIONS

Database WPI, Section Ch, Week 8803, Derwent Publications Ltd., London, GB; Class A23, AN 88–018856 XP002095190 & JP 62 282030 (Oike Kogyo KK), Dec. 7, 1987.

*Primary Examiner*—Vivian Chen
*Attorney, Agent, or Firm*—Burns, Doane, Swecker & Mathis, LLP

[57] ABSTRACT

Durable—long lived plastic films carrying sputter-deposited metal layers such as reflective metal layers on both sides are disclosed. The slip side of the plastic film is not preglowed. The nonslip side is preglowed. This combination of glowing and not preglowing leads to the desired long life.

28 Claims, 3 Drawing Sheets

DOUBLE-SIDED REFLECTOR FILMS

This application is a continuation of application Ser. No. 08/743,418, filed Nov. 1, 1996, U.S. Pat. No. 5,840,161, which is a continuation of Ser. No. 08/303,342, filed Sep. 9, 1994, abandoned.

FIELD OF THE INVENTION

This invention relates to plastic films which carry metal-containing reflector layers on both sides. More particularly, it concerns such double metal layer carrying plastic films which are light transmissive and which exhibit long-term stability.

DESCRIPTION OF BACKGROUND MATERIALS

It is common practice to employ partially reflective—partially transmissive metal layer bearing films in glazing structures. These films may be applied to the surface of glass window glazing materials. They may be laminated into glazing structures. They may be suspended alone or in combination with other sheets of glazing. These products typically have a plastic film substrate which carries the reflector metal layer adherent to it. As will be described in more detail, plastic films are often marketed with a coating, known in the art as a slip coating, on one side to facilitate handling during production and fabrication. The side of the film having the slip coating is called (not unexpectedly) the "slip" side. The other side is the "nonslip" side.

These reflector products, as a general class may be prepared by applying the reflective layer to the film with a wide range of chemical mirroring methods, vapor deposition processes and sputter deposition techniques. In sputtering, a plasma is created between two electrodes in a high vacuum chamber. This plasma causes atoms of one electrode (the target) which is either metal or a metal compound, to be dislodged and drawn toward the other electrode. The plastic film substrate is placed between the electrodes and the material dislodged from the target is deposited upon the substrate.

Sputtering processes are often accompanied by a pretreatment step called preglow. Preglow also employs a plasma that is generated under conditions such that little or no material is deposited upon the substrate.

One simple format for these films used heretofore involves a single partially transparent metal reflector layer adherent to one side of the plastic film. Another widely employed format has a partially transparent, partially reflective sequence of dielectric and metal layers on one side of the film.

Also in the past it has been proposed to place reflective layers on both sides of a plastic film. This has not found acceptance typically because the plastic substrate tends to degrade or discolor prematurely when this is done. This has been a vexing problem since double-sided materials do possess certain theoretical performance advantages.

STATEMENT OF THE INVENTION

We have now discovered a way to make stable, durable double-sided double metal-layer containing reflective plastic films using sputter-depositing.

In accord with our invention we have found that a particular regimen of preglow treatment of the plastic substrate leads to stable, durable double-sided reflective films. More particularly, we have discovered that if the nonslip side of the plastic film is preglowed and the slip side is not preglowed prior to depositing their respective reflective coatings, the resulting product is durable and more stable and acceptable for commercial application.

Thus in one embodiment this invention provides a method for producing a reflective composite film. This method applies to plastic film having a slip side and a nonslip side. It involves applying, by sputtering, a reflective layer to each side of the plastic film but preglowing only the nonslip side of the film. This method yields a coated film product which is significantly and unexpectedly more durable and long-lived than similar double-sided products made with plastic films preglowed on both sides.

In other aspects this invention is embodied as the product of this process or as a double-sided reflective film product per se. This film product has a plastic film support. This plastic film has a nonslip side which has been modified by a preglow treatment and which carries a sputter-deposited metal containing reflective layer adhered to it. It also has a slip side which has not been significantly modified by a preglow treatment and which also carries a sputter-deposited reflector layer.

In yet an additional aspect, this invention provides a plastic film product which has reflective coatings on its slip side and on its nonslip side with these reflective coatings being such as to permit a plastic film-stabilizing quantity of oxygen to permeate to the film.

DETAILED DESCRIPTION OF THE INVENTION

BRIEF DESCRIPTION OF THE DRAWINGS

This invention will be further described with reference being made to the accompanying drawing. In these drawings

DESCRIPTION OF PREFERRED EMBODIMENTS

Figure 1:
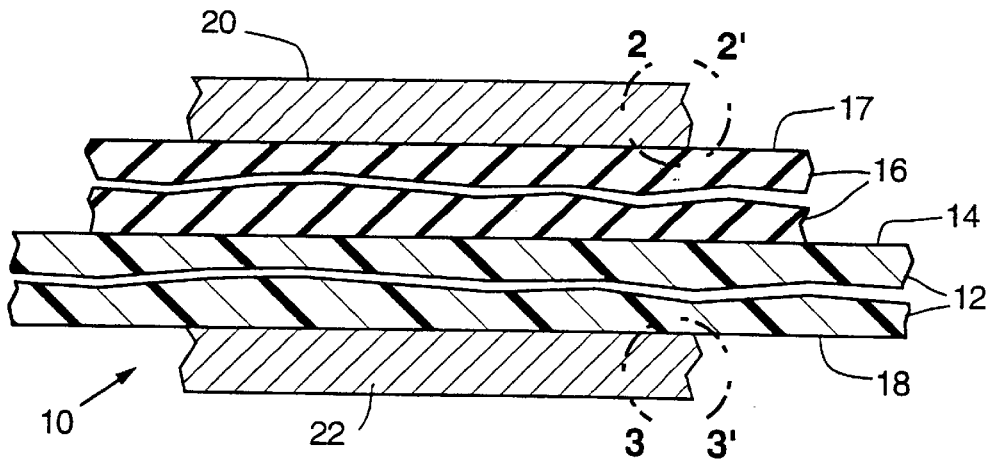
FIG. 1 is a schematic cross-sectioned view of a product of this invention.

The present invention provides effective long lived double-sided reflective films. A general representation of such products is shown in FIG. 1 as film product 10. Film product 10 includes a plastic film substrate 12. This plastic film is typically from about 0.5 to about 5 or 10 mils thick, although this film thickness is not seen to be a limitation on the applicability of the invention.

Plastic film 12 is typically a flexible organic polymer film. The polymers which make up plastic film 12 are carbon-based materials. They include organic polymers such as polyhydrocarbons, polyoxyhydrocarbons and polysulfohydrocarbons, and fluorocarbon and polysulfohydrocarbons, and fluorocarbon and fluorohydrocarbon materials as well. Representative organic polymers include polyesters such as poly(ethyleneterephthalate) ("PET") and poly(butyleneterephthalate), polyacrylates and methacrylates such as poly(methylmethacrylate) ("PMMA'), poly(methacrylate), and poly(ethylacrylate), copolymers such as poly(methylmethacrylate-coethylacrylate) and polycarbonates. (A further description of suitable polyester and polycarbonate materials may be found at pages 129–135 of the McGraw-Hill *Encyclopedia of Science and Technology, Volume* 14 (1987.) Fluorocarbon polymers such as Teflon and the various fluorohydrocarbon polymers such as Teflon and the various fluorohydrocarbon polymers known in the art can be used as well. Polyesters, such as poly(acrylates), poly(methacrylates), poly(ethyleneterephthalate) (PET) and poly(butyleneterephthalate) are preferred plastics for the plastic film 12, with PET being the most preferred.

Although not a limitation to the application of this invention, clear, transparent, colorless plastic film materials give attractive final materials. When used in the context of plastic or polymer materials, the term "clear, transparent, colorless" means a plastic or polymer which, in its configuration of use, exhibits an integrated transmission over the visual wavelengths (400–700 Nm) of at least about 75%, i.e., from about 70% to about 95% without marked absorption or reflection peaks in this range. The polymers described above, when in typical configurations of use (i.e., plastic sheets or 0.5 to 5 mil thick films), commonly have from about 5 to about 20% reflection plus absorption, integrated over the visual wavelengths and thus integrated transmissions in the 80 to 95% range, and can qualify as "clear, transparent, colorless" substrates. For example, a 1 to 3 mil thick film of commercial PET reflects and absorbs a total of about 10 to 15% of the visible light cast upon it.

The polymer substrates themselves are commercially available or can be prepared by various art-known processes and do not, in and themselves, constitute an aspect of this invention.

This plastic film has two surfaces, 14 and 18. One of these surfaces (14) carries a primer layer or slip layer 16 which is typically thinner than the film itself but still is on the order of tenths of mils in thickness. Slip layer 16 is commonly selected from acrylate, polyester, and other organic polymeric materials suitable for improving the durability, handleability and/or processability of the plastic film.

Slip layer 16 has a metal-containing reflective layer 20 adhered to it while surface 18 of substrate 12 also carries a reflective layer 22. These reflective layers 20 and 22 are characterized by being partially reflective and partially transparent and by having thin layers of metal in them. Most commonly, they are each designed to transmit at least about 20% of the total radiation present in visible light. The usual reason for incorporating layers such as 20 or 22 in a structure is to differentially transmit and reflect various portions of the electromagnetic spectrum. Most commonly, it is desired to preferentially reflect long wave lengths (heat) and transmit the wavelengths of visible light so as to achieve varying degrees of thermal control in architectural or automotive window settings.

No single reflector such as 20 or 22 is 100% effective at reflecting any particular wavelengths. The non-reflected components are then conducted through the layers 12 and 16 and out the other side of the film structure. When, as in film 10, a second reflector is positioned on the other side of the film, it can at least partially reflect the conducted energy and thus improve the reflective properties of the overall film.

While having two reflectors 20 and 22 is a help for optical reflectance performance, prior to this invention, it also leads to problems. In accord with this invention, surface 18, the nonslip surface, is subjected to a preglow treatment before reflector 22 is deposited upon it. In contrast, slip side surface 14 or 17 is not preglowed. This preferential preglowing of only one side (side 18) of film 12 yields a product which has longer life and does not yellow or otherwise degrade at an unacceptable level during use.

The preglow that is applied to the nonslip side of the plastic substrate is generally classified as a mild or nonrobust glow. It is generally carried out using argon or air or some other oxygen-containing gas (i.e., a gas containing from about 5 to about 50% oxygen). A dc power source is used, with the preglow voltage ranging from about 750 to almost 5000 volts, and most commonly from about 1000 to about 3000 volts.

The reflective layers 20 and 22 are laid down by sputter-depositing upon the nonglowed slip side and glowed nonslip side of the film. These reflective layers can be simple thin layers of metal, for example silver, copper, gold, iridium, palladium, nickel, platinum, or the like. In our products, we prefer silver or mixtures of metal in which silver predominates because of its excellent color neutrality but if this is not important, lower cost metals such as copper or nickel might be preferred.

Figure 2:
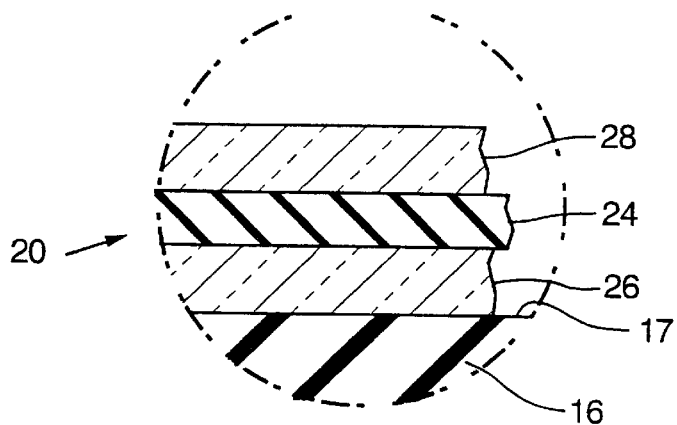
FIGS. 2 and 3 are expanded scale cross-sectioned views of regions of the product of FIG. 1.
Figure 3:
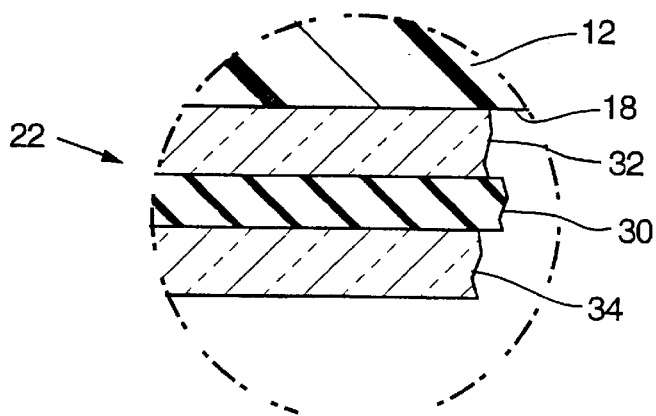

Often, however, better results are achieved if a combination of metal and dielectric layers are employed as illustrated in FIGS. 2 and 3. In FIG. 2 slip layer 16 is shown. a reflective metal layer 24 is also depicted bounded by layers of dielectric 26 and 28. These dielectric layers are known to enhance the performance and selectivity of the reflective layers.

As shown in FIG. 3, a combination of metal layer 30 and dielectric layer 32 and 34 can be applied to the lowest nonslip side 18 of the plastic layer 12. The metal layers are from about 30 to about 1,000 Å in thickness. The dielectric layers are from about 30 to about 1,500 Å in thickness. These configuration layers are merely representation and do not by themselves constitute the present invention. Other configurations, such as those having multiple metal layers, can also be employed.

Examples of dielectric materials include without limitation metal oxides, nitrides and sulfides with metal oxides such as $TiO_2$, $Ti_2O_3$, $ZnO$, $Bi_2O_3$, $In_2O_3$, $SnO_2$, $ZrO_2$, $A_2O_3$, and mixtures thereof being preferred.

The metal-containing reflectors are applied to the treated plastic films using sputter-depositing. Sputter-depositing is a commercial process for depositing inorganic materials such as metals, oxides, and the like on surfaces. Representative descriptions of sputter-depositing processes and equipment may be found in U.S. Pat. Nos. 4,204,942 and 4,948,087, which are incorporated by reference.

In sputtering, a voltage is applied to a metal or metal compound sputtering cathode (target) in the presence of a gas to create a plasma. The action of the sputtering gas plasma on the target causes atoms of the target to be dislodged and to travel and deposit upon a substrate positioned adjacent to the sputtering source.

The thickness of the layer of material laid down is controlled by varying the voltage and current fed to the electrode targets, the gas flow rates and, in the case of continuous systems where the polymer surface and sputtering target move relative to one another, the speed at which the surface is moved past the target.

Typically, the sputtering gas is a nonreactive noble gas such as krypton or argon or the like. Argon is the most common sputtering gas because of its relatively attractive cost. In some sputtering processes, known as reactive sputtering processes, one adds substantial amounts of one or more reactive gases such as oxygen or nitrogen during the metal lay down. This results in a compound such as an oxide or nitride being formed and deposited.

Figure 4:
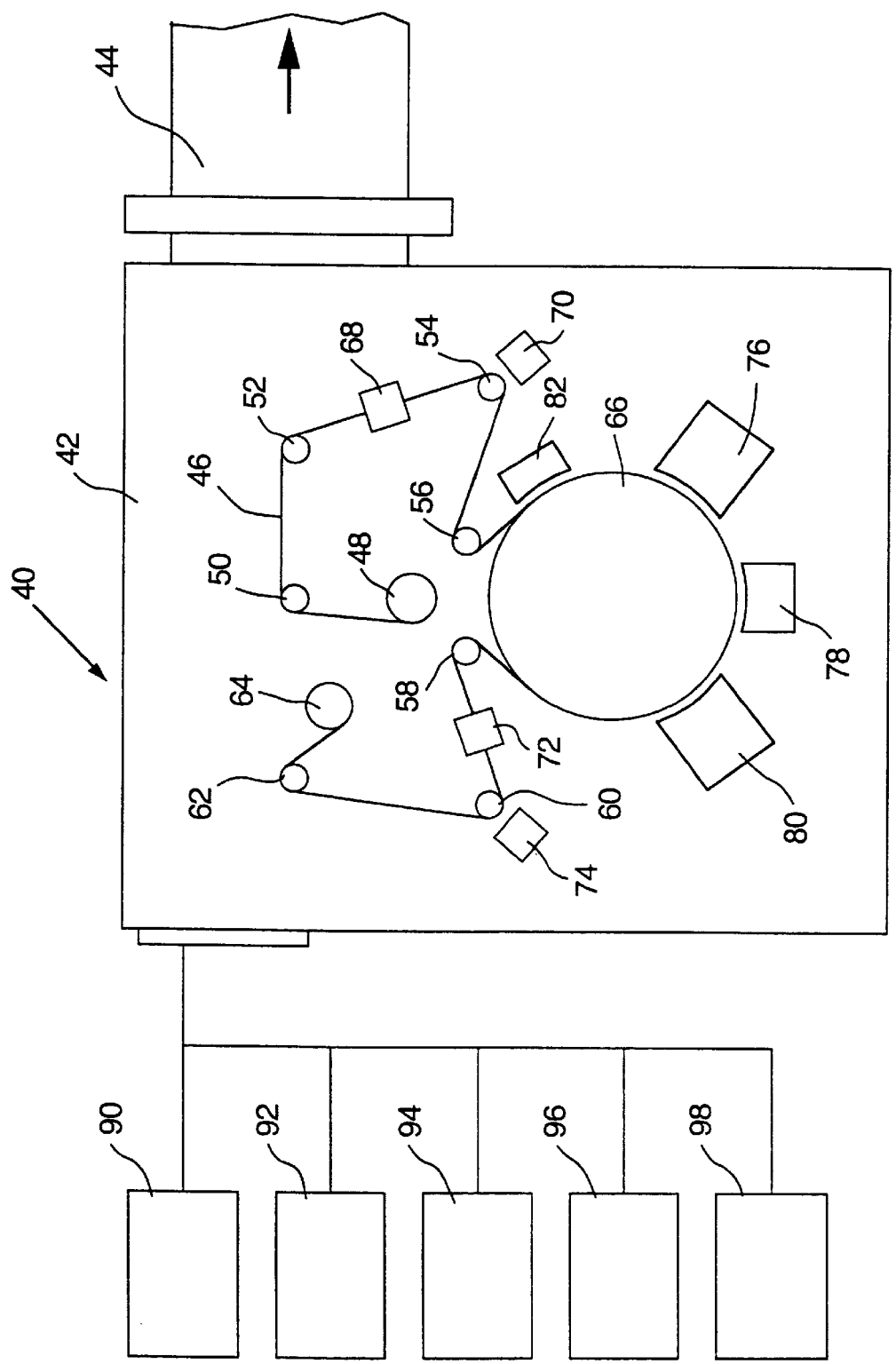
FIG. 4 is a diagram showing one type of equipment for carrying out the process and making the products of this invention.

FIG. 4 shows a continuous web coating sputtering system 40 suitable for laying down these various layers. System 40 includes vacuum chamber 42 which is evacuated via line 44. Contained within chamber 42 is a drive mechanism for moving a sheet of flexible polymer film 16 past a series of magnetron sputtering stations 80, 78, and 76. The drive mechanism includes feed roll 48, idlers 50, 52, 54, 58, 60 and 62 and take-up roll 64.

The film passes around chilled idler drum 66 as well. The film passes a pair of monitors for determining its transmittance, 68, and reflectance, 70, before coating and a similar pair of monitors 72 and 74 after coating. This coater is configured to simultaneously sputter-deposit up to three layers on the plastic film using three separate DC magnetron cathodes 76, 78 and 80. Typically, cathode 76 is used to lay down a first dielectric promoting layer. Cathode 78 can be used to lay down the metal layer. Cathode 80 can be used to lay down an overcoating dielectric layer, if desired. Also located in the system is a pre-glow station 82 for treating the nonslip side of the plastic film before coating. Each of these four stations is isolated from each other in space as a minichamber (see U.S. Pat. No. 4,298,444), thereby producing a local environment for the containment of the various plasma gases. This allows separate processes to be carried out simultaneously at each station with variations in atmosphere from station to station but with minimal cross-contamination among the four sources.

The control and monitoring of the sputtering system are normally accomplished using equipment and sensors which are common in machines of this type. These are shown in FIG. 4 and include: 1) mass flow controllers 90 (MKS) for regulation of gas flow into the cathode minichambers; 2) 5–10 kilowatt DC power supplies 92 (Advanced Energy) for all three sputtering cathodes and a power supply 94 for the preglow; 3) an optical monitoring system 96 (Hexatron/Southwall Technologies) which measures both reflectance and transmission of the film over the spectral region from 360 to 2,000 Nm; and 4) a film motion control system 98 (Drivex) which regulates the tension, speed, and distance of the film as it moves through the system.

When carrying out the process of the invention there is some latitude in the order in which the preglow and the various depositions are carried out. for example, the nonslip surface can be preglowed as a first step followed by depositing the two reflectors in either order. Alternately, the slip side reflector can be applied followed by the nonslip side preglow and the deposit of the nonslip side reflector. In addition, when multi-layer reflectors are employed it is, at least in theory, possible to divide up the deposition of some of these layers. However, based on manufacture of other products, it is usually preferred to have the preglow immediately precede the lay down of the nonslip side reflector.

The invention will be further described by the following examples and comparative experiments. These merely set forth particular embodiments of the invention and are not to be construed as limiting the invention's scope which is defined by the claims.

EXAMPLES

In Example 1, the preparation of a material of the invention is described. In Comparative Examples A and B, the preparation of a single-sided material and a double-sided material not of the invention are described.

In Example 2, the testing of the three materials to determine yellowing rates is described. Oxygen-permeability was also determined for various materials and is reported.

Example 1

A film product of the invention was prepared as follows. A supply of 3 mil thick poly(ethyleneterephthalate) was obtained. This material, a commercial material marketed by Teijin, had a slip coating of polyester and acrylate on one side. The other side was uncoated.

This material was converted into a double sided reflector film as follows. It was loaded into a laboratory scale moving web sputtering unit of the general type shown in FIG. 4.

This preparation involved a two pass coating operation with a three cathode dielectric/metal/dielectric ("DMD") stack being deposited on both sides of the substrate. In the first pass, the nonslip side was coated using a dc preglow. In the second pass, the slip side was coated with the DMD coating using no dc preglow.

Pass I Deposition conditions:
  Linespeed: 7.74 mm/sec
  Substrate Side: nonslip
  Approximate stack design: 410 Å $In_2O_3$/90 Å Ag/410 Å $In_2O_3$
  Preglow: 1500 V @ 32.5 mA, 13.6 sccm of air, pressure $10 \times 10^{-3}$ Torr.
  Cathode 1: Indium sputtered reactively to obtain $In_2O_3$.

36.4 sccm oxygen
16.4 sccm hydrogen
4 sccm nitrogen
5 sccm argon
pressure: $4.5 \times 10^{-3}$ Torr
16.24 A @ 339 V (5.51 Kw)

Cathode 2: Silver dc sputtered.

12.3 sccm argon
pressure: $3.0 \times 10^{-3}$ Torr
1.13 A @ 447 V (0.51 Kw)

Cathode 3: Indium sputtered reactively to obtain $In_2O_3$.

34.4 sccm oxygen
32.6 sccm hydrogen
4 sccm nitrogen
5 sccm argon
pressure: $5.2 \times 10^{-3}$ Torr
18.52 A @ 302 V (5.60 Kw)

Pass II Deposition conditions:
  Linespeed: 7.74 mm/sec
  Substrate Side: slip side
  Approximate stack design: 410 Å $In_2O_3$/90 Å Ag/410 Å $In_2O_3$ Preglow: off, 11.0 sccm of air, pressure ca 10×10⁻³ Torr.

Cathode 1: Indium sputtered reactively to obtain $In_2O_3$.

---
36.8 sccm oxygen
16.6 sccm hydrogen
4 sccm nitrogen
5 sccm argon
pressure: $4.7 \times 10^{-3}$ Torr
16.22 A @ 339 V (5.50 Kw)
---

Cathode 2: Silver dc sputtered.

---
12.3 sccm argon
pressure: $3.0 \times 10^{-3}$ Torr
1.14 A @ 441 V (0.50 Kw)
---

Cathode 3: Indium sputtered reactively to obtain $In_2O_3$.

---
33.2 sccm oxygen
31.5 sccm hydrogen
4 sccm nitrogen
5 sccm argon
pressure: $5.2 \times 10^{-3}$ Torr
18.66 A @ 300 V (5.60 Kw)
---

Comparative Experiment A

For the purposes of comparison, a single-sided product was produced in the same equipment. This material consisted of a single pass, dielectric/metal/dielectric stack deposited onto the slip side of the Teijin 3 mil PET of Example 1 with a dc preglow. A three cathode with preglow process was used.

The dc preglow operating conditions used to prepare this sample were those which were required in order to deposit silver onto the slip side of PET with similar optical properties as obtained when the nonslip side was coated. In particular, the glow voltage and current were increased as required to minimize visible absorption.

Deposition conditions:

Linespeed: 6.46 mm/sec

Substrate Side: slip side

Approximate stack design: 300 Å $In_2O_3$/90 Å Ag/550 Å $In_2O_3$

Preglow: 2500 V @ 100 Ma, 8.2 sccm of air, pressure 10×10⁻³ Torr.

Cathode 1: Indium sputtered reactively to obtain $In_2O_3$.

---
22.8 sccm oxygen
10.3 sccm hydrogen
4 sccm nitrogen
5 sccm argon
pressure: $3.5 \times 10^{-3}$ Torr
7.7 A @ 332 V (2.56 Kw)
---

Cathode 2: Silver dc sputtered.

---
13 sccm argon
pressure: $3.0 \times 10^{-3}$ Torr
0.92 A @ 438 V (0.40 Kw)
---

Cathode 3: Indium sputtered reactively to obtain $In_2O_3$.

---
35.8 sccm oxygen
34.0 sccm hydrogen
4 sccm nitrogen
5 sccm argon
pressure: $5.4 \times 10^{-3}$ Torr
17.84 A @ 313 V (5.58 Kw)
---

Comparative Experiment B

Also for purposes of comparison, a second double-sided material was prepared. It was similar to the material of Example 1 and was produced in the same equipment, but had each of its sides preglowed before reflector deposition.

This sample involved a two pass coating operation with a three cathode (i.e. dielectric/metal/dielectric) stack being deposited on each side of the substrate. In the first pass I, the nonslip side of the same Teijin 3 mil PET was coated using a dc preglow. In the second pass, the slip side of the PET substrate was coated with the DMD coating also using a dc preglow. The dc preglow operating conditions used in the second pass was that which was required in order to deposit silver onto the slip side of PET with similar optical properties as obtained when the nonslip side was coated.

Pass I Deposition conditions:

Linespeed: 17.25 mm/sec

Substrate Side: nonslip

Approximate stack design: 200 Å $In_2O_3$/90 Å Ag/200 Å $In_2O_3$

Preglow: 1500 V @ 40 Ma, 14.4 sccm of air, pressure 11×10⁻³ Torr.

Cathode 1: Indium sputtered reactively to obtain $In_2O_3$.

---
38.4 sccm oxygen
17.4 sccm hydrogen
4 sccm nitrogen
5 sccm argon
pressure: $4.7 \times 10^{-3}$ Torr
15.90 A @ 345 V (5.49 Kw)
---

Cathode 2: Silver dc sputtered.

---
12.6 sccm argon
pressure: $3.0 \times 10^{-3}$ Torr
2.12 A @ 544 V (1.15 Kw)
---

Cathode 3: Indium sputtered reactively to obtain $In_2O_3$.

---
36.2 sccm oxygen
34.4 sccm hydrogen

```
4 sccm nitrogen
5 sccm argon
pressure: 5.4 × 10⁻³ Torr
17.54 A @ 317 V (5.56 Kw)
```

Pass II Deposition conditions:

Linespeed: 6.46 mm/sec

Substrate Side: slip side

Approximate stack design: 300 Å $In_2O_3$/90 Å Ag/550 Å $In_2O_3$

Preglow: 2500 V @ 100 Ma, 8.0 sccm of air, pressure 11×10⁻³ Torr.

Cathode 1: Indium sputtered reactively to obtain $In_2O_3$.

```
22.5 sccm oxygen
10.2 sccm hydrogen
4 sccm nitrogen
5 sccm argon
pressure: 3.5 × 10⁻³ Torr
7.76 A @ 332 V (2.58 Kw)
```

Cathode 2: Silver dc sputtered.

```
13.0 sccm argon
pressure: 3.0 × 10⁻³ Torr
0.92 A @ 437 V (0.40 Kw)
```

Cathode 3: Indium sputtered reactively to obtain $In_2O_3$.

```
35.2 sccm oxygen
33.5 sccm hydrogen
4 sccm nitrogen
5 sccm argon
pressure: 5.4 × 10⁻³ Torr
17.90 A @ 311 V (5.57 Kw)
```

Example 2

The QUV a Yellowing Test

To determine the rate at which PET based reflector samples yellow when exposed to solar radiation, an accelerated test was done. In this test sample films were suspended into sealed air filled insulated glass units ("IGUs"). The igu's are fabricated using low iron glass (i.e. UV transmissive) on the exposed side of the unit. As described in ASTM G53-84, samples were exposed to a UVA-351 bulb through 3 mm low iron glass supplied by Schott. The UV exposure was applied at a 100% duty cycle and a one sun intensity. During the exposure, the samples were held at 60° C. and a relative humidity of 40%.

Figure 5:
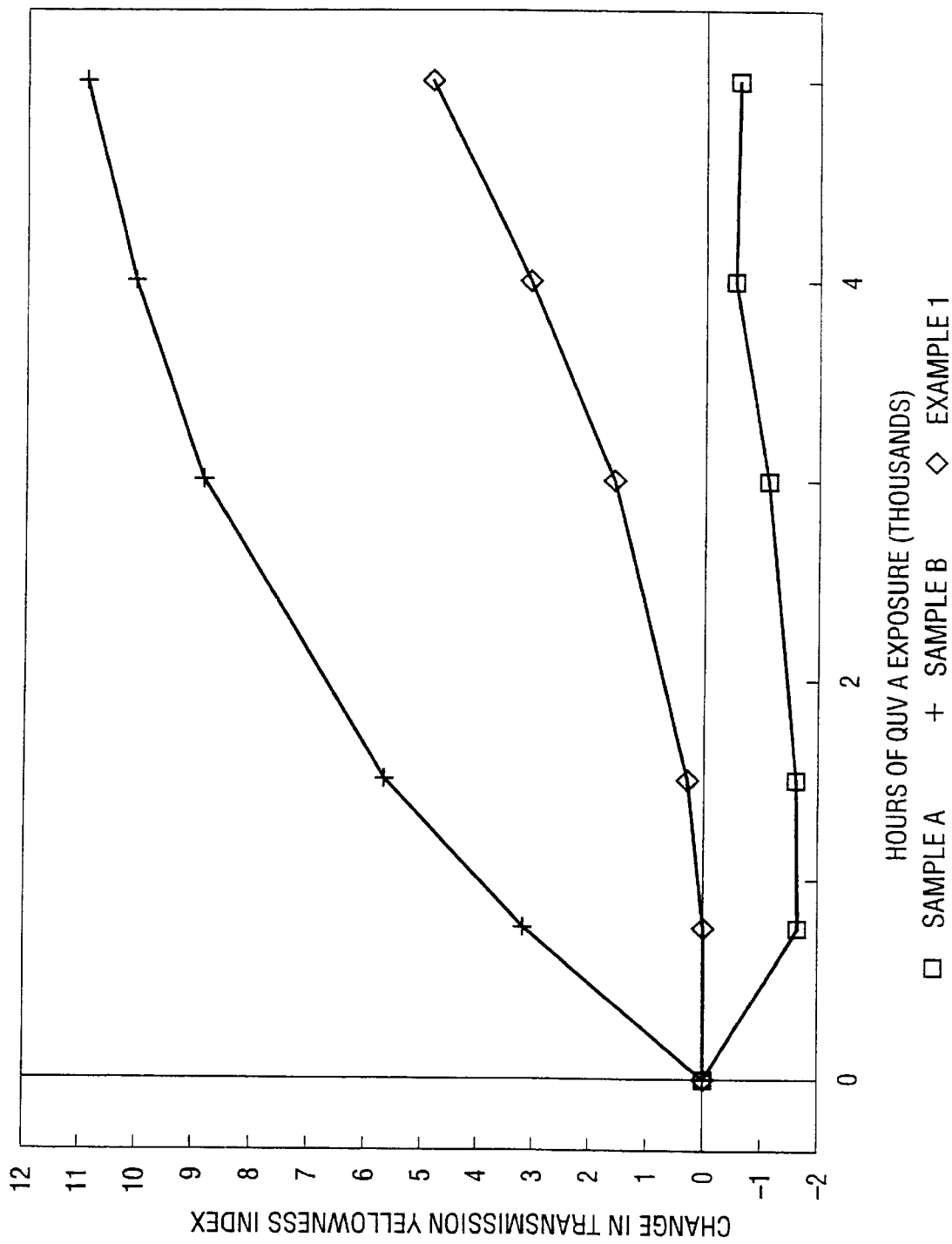
FIG. 5 is a graph showing the improved resistance to discoloration achieved in products of this invention.

The results of this exposure for three different samples (Example 1, A and B) is given in FIG. 5.

Sample B is a double sided reflector on PET. In single sided reflectors in the past the nonslip side of PET is coated with a reflective layer using a dc preglow to enhance the adhesion of the coating to PET. When the reflective coating is applied to the slip side using standard deposition conditions, the visible absorption of the coating is higher than normal leading to reduced visible transmission. It was determined that this could be corrected by increasing the voltage and current of the preglow. Thus in sample B an intense dc preglow was used when coating the slip side. As evident from FIG. 5, when a double sided coating was prepared in this manner, the yellowness index increase rapidly. (A change of about three in yellowness index is visually detectable.)

In sample A, the slip side of PET was sputter coated, just as had been done in sample B (i.e. a robust dc preglow was used). However sample A differed from sample B in that only one side of the substrate was sputter coated. As evident from the yellowing data for sample A in FIG. 5, if the front side of the PET was left uncoated, the coating process used on the slip side of both samples A and B did not lead to a rapid yellowing rate.

In the sample of Example 1, the coating was deposited directly onto the slip side of Teijin PET without a preglow. As evident from FIG. 5, this sample yellows much more slowly than the other double sided sample (i.e. sample B). This is thought to be due to the increased oxygen permeability realized when a non-glowed slip agent (as supplied by Teijin) is sputter coated.

In light of our prior work, the results given above, and oxygen permeability results reported below, it was concluded that sample B yellowed quickly because the oxygen flow to the PET substrate was severely restricted. It is believed that this is due to a high quality (i.e. dense and pinhole free) sputtered silver layer being on both sides of the substrate.

This explanation is further supported by our observation that when a reflective layer on PET is exposed to UVA radiation in the absence of oxygen (i.e. in either krypton or argon), the rate of yellowing is increased.

Also, measurements have shown that when the slip side of PET substrate is sputter coated with a reflector stack without a preglow, the oxygen permeability of the coating is about three times higher than when the nonslip side is coated using a standard preglow. In particular, samples coated on the slip side without a preglow obtain an average oxygen permeability of 0.0563 cc/100 in²/24 hr and samples coated on the nonslip side with a standard preglow obtain an average oxygen permeability of 0.0179 cc/100 in²/24 hr.

Based on these results, we have determined that a film carrying a pair of reflector permitting less than about 0.035 cc/100 in²/24 hr of $O_2$ to permeate are less preferred and that a pair of reflectors together permitting more than 0.035 and especially from about 0.035 to about 0.1 and more especially from about 0.05 to about 0.09 cc/100 in²/24 hr of $O_2$ (are preferred while these amounts) constitute preferred film-stabilizing amounts.

What is claimed is:

1. A double sided reflector composite film made up of plastic film having a slip side and a nonslip side each side carrying a metal-containing reflector layer, said composite film produced by the method comprising:
   a. preglowing the nonslip side of the plastic film thereby forming a preglowed plastic film having a preglowed nonslip side and a nonpreglowed slip side;
   b. sputter-depositing a nonslip side reflector layer on the preglowed nonslip side of the preglowed plastic film thereby forming a reflector layer carrying plastic film having a nonpreglowed slip side; and
   c. sputter-depositing a slip side reflector layer on the nonpreglowed slip side of the reflector layer carrying plastic film.

2. The composite film of claim 1 wherein the sputter-depositing of the nonslip side reflector layer in step b comprises the substeps of:
- b1. sputter-depositing a first dielectric layer
- b2. sputter-depositing a metal layer on the first dielectric layer and
- b3. sputter depositing a second dielectric layer on the metal layer.

3. The composite film of claim 2 where the sputter-depositing of the slip side reflector layer in step c comprises the substeps of:
- c1. sputter-depositing a first dielectric layer
- c2. sputter-depositing a metal layer on the first dielectric layer and
- c3. sputter-depositing a second dielectric layer on the metal layer.

4. The composite film of claim 3 wherein the preglow of step a is carried out with the addition of air.

5. The composite film of claim 4 wherein the metal layer of step b2 and the metal layer of step c2 comprise silver.

6. The composite film of claim 3 wherein the plastic film is polyester film.

7. The composite film of claim 6 wherein the polyester is poly(ethyleneterephthalate).

8. The composite film of claim 1 wherein the preglow of step a is carried out with the addition of air.

9. The composite film of claim 1 wherein the plastic film is polyester film.

10. The composite film of claim 9 wherein the polyester is poly(ethyleneterephthalate).

11. The composite film of claim 1 within said nonslip side reflector layer and said slip side reflector layer are permeable to a film stabilizing quantity of oxygen when exposed to air.

12. The composite film of claim 11 wherein said nonslip side reflector layer and said slip side reflector layer together permit more than about 0.035 cc/100 in$^2$/24 hr of $O_x$ to permeate.

13. A double sided reflector composite film made up of plastic film having a slip side and a nonslip side each side carrying a metal-containing reflector layer, said composite film produced by the method comprising:
- a. preglowing the nonslip side of the plastic film, thereby forming a preglowed plastic film having a preglowed nonslip side and a slip side;
- b. sputter-depositing a slip side reflector layer on the slip side of the preglowed plastic film thereby forming a reflector layer carrying plastic film having a preglowed nonslip side; and
- c. sputter-depositing a nonslip side reflector layer on the preglowed nonslip side of the reflector layer carrying plastic film.

14. The composite film of claim 13 wherein the sputter-depositing of the slip side reflector layer in step b comprises the substeps of:
- b1. sputter-depositing a first dielectric layer;
- b2. sputter-depositing a metal layer on the first dielectric layer; and
- b3. sputter depositing a second dielectric layer on the metal layer and the sputter-depositing of the nonslip side reflector layer in step c comprises the substeps of:
- c1. sputter-depositing a first dielectric layer;
- c2. sputter-depositing a metal layer on the first dielectric layer; and
- c3. sputter-depositing a second dielectric layer on the metal layer.

15. The composite film of claim 13 wherein the preglow of step a is carried out with the addition of air.

16. The composite film of claim 15 wherein the metal layer of step b2 and the metal layer of step c2 comprise silver.

17. The composite film of claim 16 wherein the plastic film is polyester film.

18. The composite film of claim 17 wherein the polyester is poly(ethyleneterephthalate).

19. The composite film of claim 13 within said nonslip side reflector layer and said slip side reflector layer are permeable to a film stabilizing quantity of oxygen when exposed to air.

20. The composite film of claim 19 wherein said nonslip side reflector layer and said slip side reflector layer together permit more than about 0.035 cc/100 in$^2$/24 hr of $O_2$ to permeate.

21. A double sided reflector composite film made up of plastic film having a slip side and a nonslip side each side carrying a metal-containing reflector layer, said composite film produced by the method comprising:
- a. sputter-depositing a slip side reflector layer on the slip side of the plastic film wherein the slip side is not preglowed thereby forming a non-preglowed reflector layer bearing plastic film having a nonslip side;
- b. preglowing the nonslip side of the non-preglowed reflector layer-bearing plastic film thereby forming a preglowed reflector layer bearing plastic film having a preglowed nonslip side; and
- c. sputter-depositing a nonslip side reflector layer on the nonslip side of the preglowed reflector layer bearing plastic film.

22. The composite film of claim 21 wherein the sputter-depositing of the slip side reflector layer in step a comprises the substeps of:
- a1. sputter-depositing a first dielectric layer;
- a2. sputter-depositing a metal layer on the first dielectric layer; and
- a3. sputter depositing a second dielectric layer on the metal layer and the sputter-depositing of the nonslip side reflector layer in step c comprises the substeps of:
- c1. sputter-depositing a first dielectric layer;
- c2. sputter-depositing a metal layer on the first dielectric layer; and
- c3. sputter-depositing a second dielectric layer on the metal layer.

23. The composite film of claim 22 wherein the preglow of step b is carried out with the addition of air.

24. The composite film of claim 23 wherein the metal layer of step a2 and the metal layer of step c2 comprise silver.

25. The composite film of claim 24 wherein the plastic film is polyester film.

26. The composite film of claim 25 wherein the polyester is poly(ethyleneterephthalate).

27. The composite film of claim 21 within said nonslip side reflector layer and said slip side reflector layer are permeable to a film stabilizing quantity of oxygen when exposed to air.

28. The composite film of claim 27 wherein said nonslip side reflector layer and said slip side reflector layer together permit more than 0.035 cc/100 in$^2$/24 hr of $O_2$ to permeate.

* * * * *